(12) United States Patent
Shamanna et al.

(10) Patent No.: US 10,269,417 B2
(45) Date of Patent: Apr. 23, 2019

(54) APPARATUS FOR ADAPTIVE WRITE ASSIST FOR MEMORY

(71) Applicant: Intel Corporation, Santa Clara, CA (US)

(72) Inventors: Gururaj K. Shamanna, Austin, TX (US); Stefan Rusu, Sunnyvale, CA (US); Eric A. Karl, Hillsboro, OR (US); Zheng Guo, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/115,464

(22) PCT Filed: Mar. 5, 2014

(86) PCT No.: PCT/US2014/020828
§ 371 (c)(1),
(2) Date: Jul. 29, 2016

(87) PCT Pub. No.: WO2015/134013
PCT Pub. Date: Sep. 11, 2015

(65) Prior Publication Data
US 2017/0011793 A1 Jan. 12, 2017

(51) Int. Cl.
*G11C 11/412* (2006.01)
*G11C 11/419* (2006.01)
*G11C 7/22* (2006.01)
*G11C 7/04* (2006.01)
*G11C 29/02* (2006.01)

(52) U.S. Cl.
CPC .............. *G11C 11/419* (2013.01); *G11C 7/04* (2013.01); *G11C 7/22* (2013.01); *G11C 29/021* (2013.01); *G11C 29/028* (2013.01)

(58) Field of Classification Search
USPC .......................................... 365/154
See application file for complete search history.

(56) References Cited

U.S. PATENT DOCUMENTS

| 2006/0022733 | A1 | 2/2006 | Nair |
| 2007/0115024 | A1 | 5/2007 | Goetting et al. |
| 2008/0180300 | A1* | 7/2008 | Jeong ........................ G01K 7/01 341/166 |

(Continued)

FOREIGN PATENT DOCUMENTS

CN 101017708 A 8/2007

OTHER PUBLICATIONS

Notification Concerning Transmittal of International Preliminary Report on Patentability issued for International Patent Application No. PCT/US2014/020828, dated Sep. 15, 2016.

(Continued)

*Primary Examiner* — Hoai V Ho
(74) *Attorney, Agent, or Firm* — Womble Bond Dickinson (US) LLP

(57) ABSTRACT

Described is an apparatus which comprises: a memory; a first power supply node to receive a first power supply; a second power supply node coupled to the memory to provide the memory with second power supply; a circuit coupled to the first and second power supply nodes, the circuit operable to dynamically modulate droop in the second power supply by adaptively adjusting signal characteristics of a write assist pulse.

20 Claims, 11 Drawing Sheets

(56) References Cited

U.S. PATENT DOCUMENTS

| | | | |
|---|---|---|---|
| 2009/0034354 A1* | 2/2009 | Resnick | G01R 19/16552 |
| | | | 365/228 |
| 2009/0268504 A1 | 10/2009 | Kimura et al. | |
| 2010/0128541 A1* | 5/2010 | Russell | G11C 5/147 |
| | | | 365/189.011 |
| 2010/0259313 A1* | 10/2010 | Li | G01K 3/005 |
| | | | 327/512 |
| 2012/0299636 A1 | 11/2012 | Van Winkelhoff et al. | |
| 2013/0077387 A1 | 3/2013 | Yabuuchi | |
| 2013/0294181 A1 | 11/2013 | Chang et al. | |
| 2014/0003132 A1 | 1/2014 | Kulkarni et al. | |
| 2014/0003181 A1 | 1/2014 | Wang et al. | |
| 2015/0235696 A1* | 8/2015 | Wang | G11C 11/419 |
| | | | 365/154 |

OTHER PUBLICATIONS

International Search Report for PCT/US2014/020828 dated Feb. 5, 2015, 2 pages.
Written Opinion of the International Searching Authority for PCT/US2014/020828 dated Feb. 5, 2015, 4 pages.
Chinese Office Action dated Aug. 28, 2018, (14 pages).

\* cited by examiner

APPARATUS FOR ADAPTIVE WRITE ASSIST FOR MEMORY

RELATED APPLICATION

This patent application is a U.S. National Phase Application under 35 U.S.C. § 371 of International Application No. PCT/US2014/020828, filed Mar. 5, 2014, entitled APPARATUS FOR ADAPTIVE WRITE ASSIST FOR MEMORY.

BACKGROUND

SRAM (Static Random Access Memory) bit-cell scaling is a challenge in deep sub-nanometer process technology due to, for example, increase in Random Dopant Fluctuation, Gate Work-function Variation, Device Quantization, and Bias Temperature Instability (NBTI) effects. To mitigate the above effects, Assist Circuits are used for SRAM Arrays. Examples of Assist Circuits include Write Assist (WA) and Read Assist (RA) Circuits. Write Assist (WA) Circuit in combination with Read Assist (RA) Circuit may expand the design window. This combination enables an SRAM bit-cell to meet power/performance and process scaling requirements. However, known WA and RA circuits are static in nature and do not take into account changing operating conditions (e.g., voltage, temperature, and frequency). Static WA circuits may result in overall increase in write power consumption, increase in write time, bigger SRAM bit-cell size (i.e., area increase), etc.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
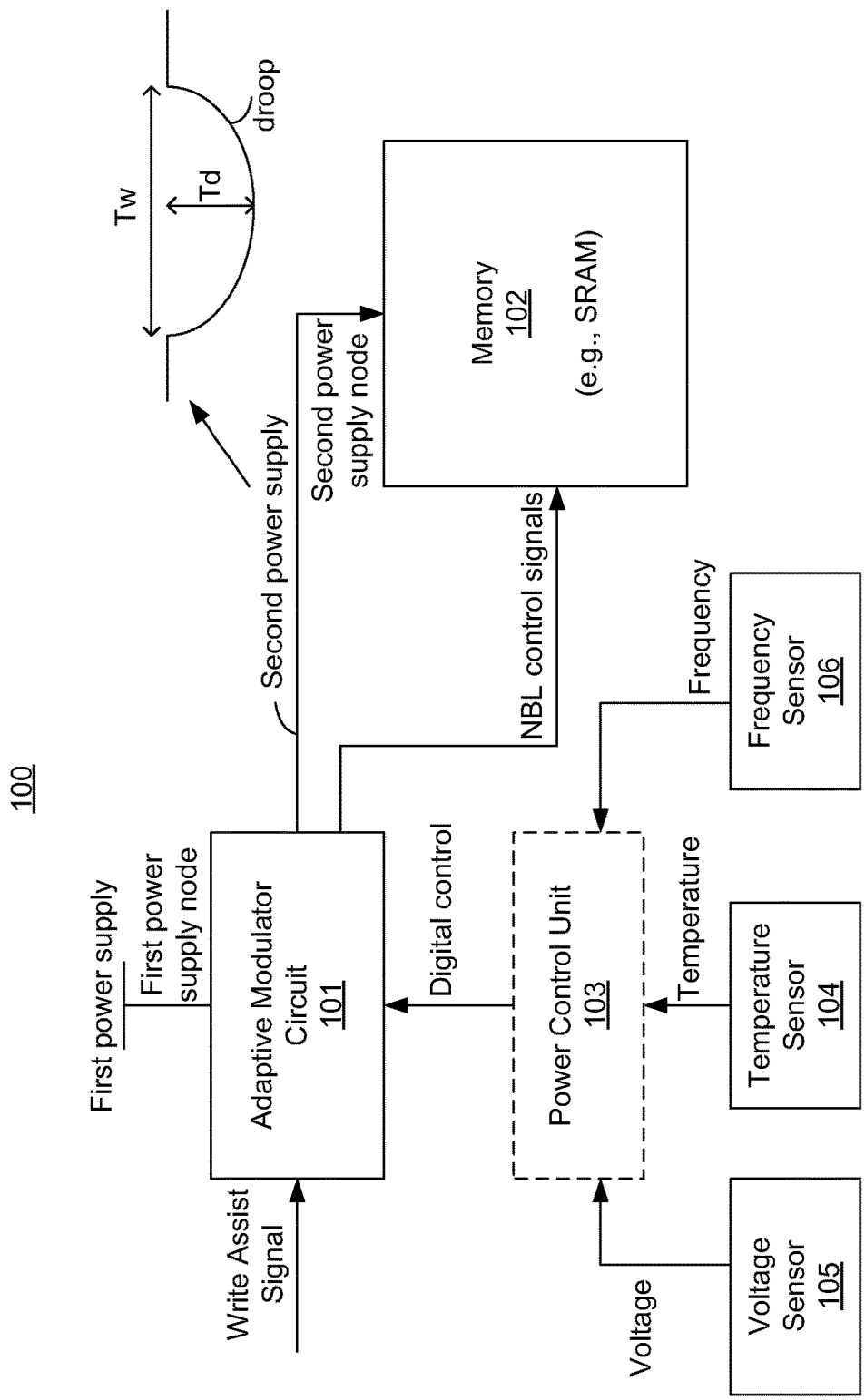
FIG. 1 illustrates a high-level circuit for providing dynamic or adaptive Write Assist (WA) to a memory, according to one embodiment of the disclosure.

During WA, power supply (i.e., VCC_SRAM) to the SRAM array is lowered (i.e., collapsed) for a predetermined duration with a predetermined droop. Collapsing power supply to the SRAM array reduces gate over-drive of p-type transistors in the SRAM bit-cell which allows for successfully writing new data into the bit-cell. For purposes of explaining the problem and solution, a 6T SRAM bit-cell is used. However, the embodiments are applicable to 4T, 8T, 10T, etc. memory bit-cells too.

Known power supply collapsing based WA circuits are static in nature i.e., WA bias voltages (which determines depth of voltage droop on the power supply) do not change based on operating voltage and temperature of the processor having the SRAM. This implies that processors have to determine a single WA bias and WA pulse width combination to ensure write-ability of all SRAM bit-cells across an entire operating voltage, frequency, temperature (V, F, and T) range.

Using the same (i.e., static) WA bias and WA pulse width setting across an entire V, F, and T range may result in an overall increase in write power consumption, increase in write time, bigger SRAM bit-cell size (i.e., area increase), etc. For example, WA pulse width and bias combination that ensures bit-cell write-ability at high voltage (e.g., 750 mV) may cause the write operation to fail at low voltage (e.g., 600 mV) due to insufficient WA pulse width. A wide WA pulse width across V, F, and T range (e.g., WA pulse width set at minimum voltage operation (VMIN)) may unnecessarily consume power when power supply level is increased above VMIN levels.

For example, power associated with WA circuits may increase by 30% when WA pulse width is determined based on VMIN operating levels of the memory. Using a large WA pulse width may also increase write time, which may become a frequency limiter. Another known technique to mitigate write-ability risk in memories is to make the bit-cell footprint (i.e., area) large. But, such techniques are not feasible for low power and smaller sized processors.

Alternative WA technique, such as Negative Bit-Line (NBL) WA technique, has similar issues as discussed above when static bit-line under-drive setting is used. In NBL based WA technique, the bit-line voltage is driven negative (relative to ground) during write operation. As a result, the drive strength of access transistor of the bit-cell is enhanced due to increase in gate over-drive. This increase in gate over-drive overpowers p-type pull-up devices and assists in writing new data into the bit-cell. The magnitude of the bit-line under-drive is controlled by the amount of charge stored on capacitors coupled to the bit-lines. Having static capacitor size or static bias conditions to either of the capacitor plates present the same issues discussed with respect to static WA pulse and bias conditions for power supply collapse WA circuits. In addition, static capacitor size or static bias conditions designed for low VMIN operation may typically result in stronger than needed negative bit-line under-drive at high operating voltages and introduce reliability concerns.

To mitigate the above problems (and other problems), the embodiments describe an apparatus and method for adaptively (or dynamically) providing WA to a memory according to operating conditions (e.g., V, F, and T). In one embodiment, duration and/or magnitude of power supply collapse to the memory is dynamically modulated during write operation depending on operating voltage and/or temperature of the processor having the memory. In one embodiment, depending on the operating conditions of the processor, only NBL based WA circuits may be enabled. In some embodiments, NBL based WA circuits in addition to power supply collapse based WA circuits may be enabled depending on the operating conditions of the processor having memory.

The term "dynamically" here generally refers to an automatic activity. For example, as voltage, temperature and/or frequency of a processor changes, characteristics of the WA circuit may be modified automatically to achieve higher performance for the processor. While the embodiments are described with reference to an SRAM, the embodiments of adaptive WA may be used for any known memory (e.g., content addressable memories (CAMs), Register files, etc.).

There are many technical effects of the embodiments. Some non-limiting technical effects include: reduction in power inefficiency and down binning risk, reduction in write power, reduction in NBL capacitor size, reduction in power consumption, reduction in memory reliability risk, mitigation of write failure risk due to aging, etc.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nanotubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a high-level circuit 100 having apparatus for providing dynamic or adaptive WA to a memory, according to one embodiment of the disclosure. In one embodiment, circuit 100 comprises Adaptive Modulator Circuit 101, Memory 102, Power Control Unit (PCU) 103, Temperature Sensor 104, Voltage Sensor 105, and Frequency Sensor 106. Circuits for providing dynamic WA to Memory 102 include Adaptive Modulator Circuit 101, Temperature Sensor 104 and/or Voltage Sensor 105 and/or Frequency Sensor 106. In one embodiment, PCU 103 is optional.

In one embodiment, Adaptive Modulator Circuit 101 receives First power supply at First power supply node, Write Assist signal, and Digital control signals from PCU 103 and/or from Temperature Sensor 104 and/or Voltage Sensor 105, and/or Frequency Sensor 106. In one embodiment, Adaptive Modulator Circuit 101 provides Second power supply on Second power supply node to Memory 102 according to WA signal and operating conditions (Voltage, Temperature, and/or Frequency) of the processor having Memory 102. In one embodiment, PCU 103 provides a Digital control to Adaptive Modulator Circuit 101 to provide updated Voltage, Temperature, and/or Frequency of the processor having Memory 102.

In one embodiment, Temperature Sensor 104 is any known thermal sensor. In one embodiment, Voltage Sensor 105 includes a comparator that compares First power supply with a programmable voltage threshold to determine whether the First power supply is above or below the programmable voltage threshold. In one embodiment, Frequency Sensor 106 comprises a counter to determine operating clock frequency of the processor. In one embodiment, Frequency Sensor 106 may read divider ratio of a phase locked loop to determine frequency of the processor.

In one embodiment, Adaptive Modulator Circuit 101 dynamically modulates pulse width (Tw) and magnitude (Td) of droop in the Second power supply according to the WA signal and operating conditions of the processor. For example, when the First power supply falls below a threshold (e.g., 750 mV), Adaptive Modulator Circuit 101 may select a stronger WA bias setting to prevent AC retention failures (i.e., stronger WA bias setting does not help to prevent AC retention failures unless coupled with weak pulse settings; stronger WA bias settings used at lower voltages is generally to ensure cell write-ability), and/or select a longer WA pulse width setting to ensure cell write-ability. In another example, when the First power supply rises above the threshold, Adaptive Modulator Circuit 101 may select a weaker WA bias setting to eliminate or reduce risk of AC retention failure, and/or select a shorter WA pulse width setting.

In one embodiment, Adaptive Modulator Circuit 101 dynamically determines NBL WA control signals to modulate the NBL pulse, and/or capacitor size, and/or bias to either plates of the capacitor coupled to bit-lines when NBL WA technique is enabled and according to operating conditions of the processor. For example, when the First power supply falls below a threshold (e.g. 750 mV), Adaptive Modulator Circuit 101 may select a larger capacitor size to ensure cell write-ability. In another example, when the First power supply rises above the threshold, Adaptive Modulator Circuit 101 may select a smaller capacitor size to alleviate reliability risks and reduce power consumption.

In one embodiment, Adaptive Modulator Circuit 101 can selective enable or disable the NBL WA circuit and/or Second power supply collapse WA technique based on voltage, temperature, and frequency conditions. For example, when the temperature falls below a temperature threshold (i.e., cold temperature e.g., 10° C.), then Adaptive Modulator Circuit 101 enables NBL WA circuit and Second power supply collapse WA technique. In another example, when the temperature rises above a temperature threshold (i.e., hot temperature e.g., 100° C.), then Adaptive Modulator Circuit 101 enables only NBL WA technique.

In one embodiment, Adaptive Modulator Circuit 101 is coupled to bit-lines of the memory 102. In one embodiment, Adaptive Modulator Circuit 101 is operable to dynamically modulate voltage droop in the bit-lines of memory 102 by adaptively adjusting the capacitance associated with the bit-lines.

Figure 2:
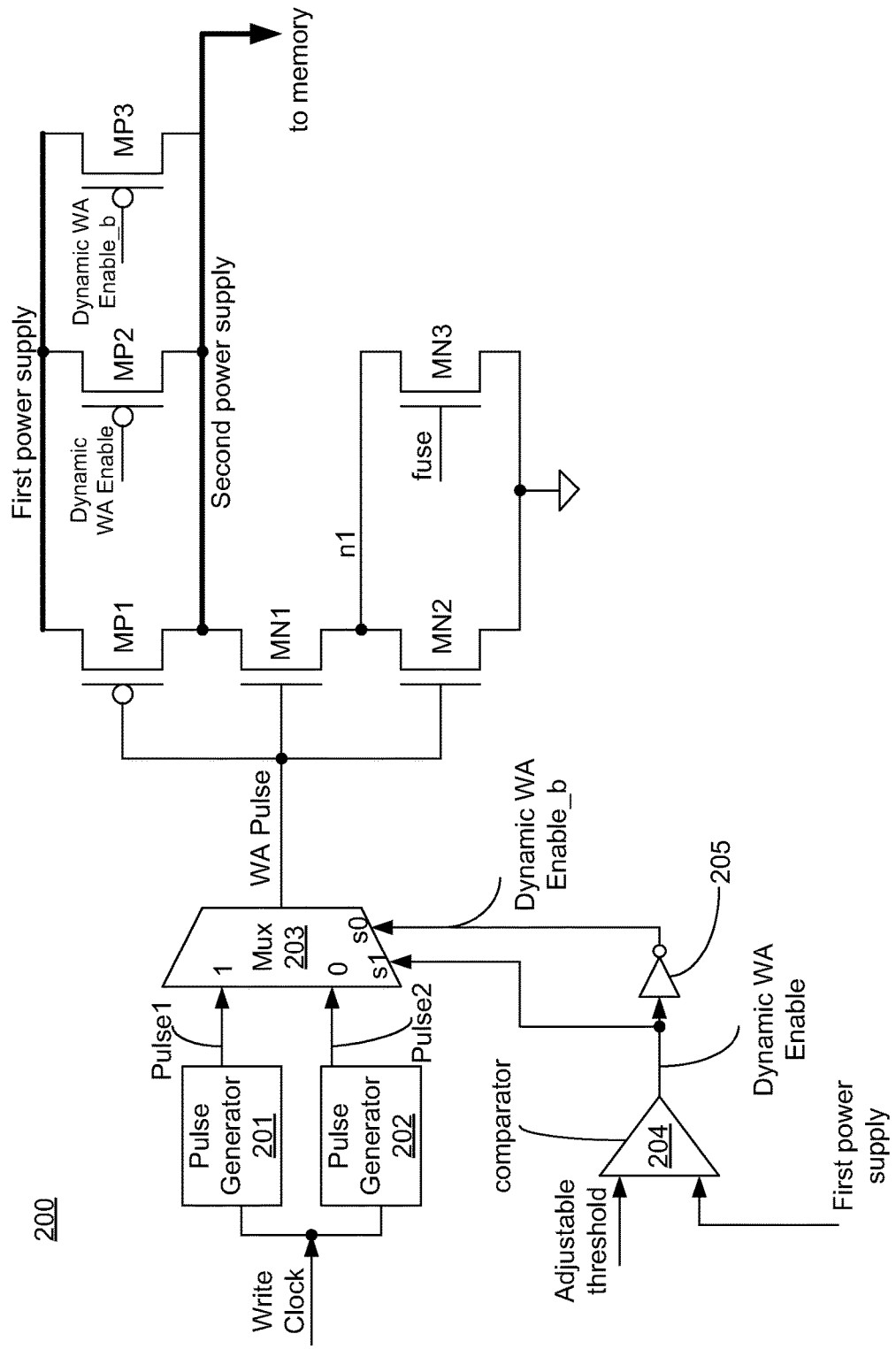
FIG. 2 illustrates a circuit for providing dynamic or adaptive power supply collapse WA to a memory according to changing voltage supply levels, according to one embodiment of the disclosure.

FIG. 2 illustrates a circuit 200 for providing dynamic or adaptive WA to a memory according to changing voltage supply levels, according to one embodiment of the disclosure. It is pointed out that those elements of FIG. 2 having the same reference numbers (or names) as the elements of any other figure can operate or function in any manner similar to that described, but are not limited to such.

Circuit 200 is one exemplary embodiment of Adaptive Modulator Circuit 101 using a Voltage Sensor (e.g., 105) of FIG. 1. Referring back to FIG. 2, in one embodiment, Circuit 200 comprises Pulse Generator 201, Pulse Generator 202, Multiplexer (Mux) 203, comparator 204, inverter 205, p-type devices MP1, MP2, MP3, and n-type devices MN1, MN2, and MN3. In one embodiment, comparator 204 and inverter 205 are part of Voltage Sensor 105. In one embodiment, Pulse Generator 201, Pulse Generator 202, Multiplexer (Mux) 203, p-type devices MP1, MP2, MP3, and n-type devices MN1, MN2, and MN3 are part of Adaptive Modulator Circuit 101.

In one embodiment, Pulse Generator 201 receives Write Clock (or Write signal) as input and generates Pulse1 signal having a first pulse width. In one embodiment, Pulse Generator 202 receives Write Clock (or Write signal) as input and generates Pulse2 signal having a second pulse width, where Pulse2 signal has a shorter pulse width than the pulse width of Pulse1 signal. In one embodiment, pulse width is adjusted by adjusting delay of delay lines in the pulse generator. Here, pulse width refers to duration of logic high of Pulse signal. However, the concept of the embodiments is also applicable when using a pulse width defined by duration of logic low of the Pulse signal. While the embodiments show two different pulse width signals Pulse1 and Pulse2, any number of pulse width signals may be used to provide a finer granularity and/or larger pulse width range for changing the power supply collapse duration Td of the Second power supply.

In one embodiment, Mux 203 receives Pulse1 and Pulse2 signals as inputs and selectively provides a WA Pulse as output according to select signals—Dynamic WA Enable and Dynamic WA Enable_b, where "Enable_b" is an inverse of "Enable" signal. In this example, Mux 203 is a 2:1 multiplexer. For embodiments having more than two pulse signals as input for Mux 203, a large multiplexer e.g., 4:1, 5:1, etc. may be used.

In one embodiment, select signals—Dynamic WA Enable and Dynamic WA Enable_b—are generated by PCU 103, Voltage Sensor 105, and/or Temperature Sensor 106. In this exemplary embodiment, select signals—Dynamic WA Enable and Dynamic WA Enable_b—are generated by Voltage Sensor 105 which comprises comparator 204 and inverter 205. In one embodiment, comparator 204 compares Adjustable threshold with First power supply to generate Dynamic WA Enable. In one embodiment, Adjustable threshold is generated by a bandgap circuit (not shown) and resistor (or diode connected transistor) based voltage divider (not shown). For example, a bandgap circuit can generate a bandgap reference (e.g., 1V), which is then divided down by a resistor divider network coupled to a multiplexer such that the output of the multiplexer is the Adjustable threshold while the multiplexer select signals are programmable. In other embodiments, other types of circuits may be used for providing Adjustable threshold for comparator 204.

In one embodiment, Adjustable threshold is coupled to the positive terminal of comparator 204 while First power supply is coupled to the negative terminal of comparator 204. In one embodiment, depending upon the operating voltage of First power supply, output of comparator (i.e., Dynamic WA Enable) will be either a logic '1' or logic '0.' In one embodiment, based on the logic level of Dynamic WA Enable, one or more of the WA transistors MP1-MP3 and MN1-MN3 are enabled or disabled. In one embodiment, a multiplexer (not shown) is inserted between comparator 204 and resistor divider network to compensate for any inherent offset in comparator 204 or to choose a different threshold voltage in post-silicon based on material type (e.g., typical material type, slow material type, fast material type). In one embodiment, a single copy of comparator 204 is used for memory 102 independent of size of memory 102.

In one embodiment, the duration of collapse in Second power supply (i.e., the duration of droop) is controlled by pulse generators 201 and 202. In one embodiment, MP1, MN1, and MN2 are coupled together in series. In one embodiment, MN3 is coupled in parallel to MN2 via node n1 and is controlled by a fuse signal (or a signal controllable by software). In one embodiment, by enabling MN3 (i.e., coupling its gate terminal to logic high), total width for MN2 can be adjusted (i.e., increased). In one embodiment, the depth of droop in Second power supply is adjusted by MP2 and MP3. While the embodiments are explained with reference to certain number of transistors for controlling duration Td and depth Tw of collapse in Second power supply, any number of transistors can be used to cause dynamic/adaptive WA for memory 102. In one embodiment, Second power supply collapse magnitude (i.e., depth of droop) can be decreased by increasing WA bias strength for MP2 and MP3.

For example, depth of droop in Second power supply can be decreased by switching from MP2 to MP3, where MP3 is smaller in size (i.e., W/L) than MP2. In another example, duration of droop in Second power supply can be shorted by decreasing WA pulse width i.e., switching from Pulse Generator 201 to Pulse Generator 202, where Pulse Generator 201 has longer delay chain that forms Pulse1 than delay chain of Pulse Generator 202.

In one embodiment, for adaptively adjusting magnitude and duration of droop in Second power supply, comparator 204 senses change in operating voltage of First power supply. In one embodiment, output of comparator indicates whether First power supply is above or below the Adjustable threshold. In this example, for purposes of explaining the embodiment, output of comparator 204 is logic high output when First power supply exceeds the Adjustable threshold, and is logic low output when First power supply falls below the Adjustable threshold.

Adaptive WA scheme can be described with the following example. Assume that First power supply is in the range of 750 mV to achieve 2.5 GHz frequency operation. In this example, Adjustable threshold is set to 750 mV. When First power supply falls below 750 mV, Dynamic WA Enable transitions from logic low to logic high while Dynamic WA Enable_b transitions from logic high to logic low. In this embodiment, MP3 is enabled (i.e., turned ON) while MP2 is disabled (i.e., turned OFF). Since MP3 is larger in size than MP2, WA bias strength increases. Continuing with the example, Mux 203 selects Pulse1 for WA Pulse which is received by MP1, MN1, and MN2. Here, a stronger WA bias setting prevents AC (alternating current) retention failures while a longer WA pulse width setting (by selecting Pulse1) ensures cell write-ability.

When the First power supply rises above Adjustable threshold of 750 mV, Dynamic WA Enable transitions from logic low to logic high while Dynamic WA Enable_b transitions from logic high to logic low. In such an embodiment, MP2 is enabled while MP3 is disabled. Continuing with the example, Mux 203 selects Pulse2 for WA Pulse which is received by MP1, MN1, and MN2. Pulse2 is shorter than Pulse1 in pulse width. A weaker WA bias setting lowers power consumption because depth of collapses of Second power supply is reduced. A shorter WA pulse width setting allows for cell write-ability by assisting write completion while allowing the processor to operate at a higher voltage and/or frequency.

Table 1 quantifies the timing and power benefit from the various embodiments relative to static WA technique.

TABLE 1

Normalized improvement in Write Performance from Adaptive WA

|  | Dynamic Power of WA Circuit (mW) | Bit-cell Write Time (pS) | Leakage Power (mW) |
| --- | --- | --- | --- |
| Static WA Scheme | 1 | 1 | 1 |
| Dynamic WA Scheme | 0.66 | 0.80 | 0.68 |
| % Improvement | 34% | 20% | 32% |

In static WA techniques, WA bias transistors (e.g., MP2 and MP3) are always turned ON for the entire lifetime (e.g., seven years) of the processor, making the transistors (i.e., MP2 and MP3) susceptible to aging. Due to continuous aging related stress, threshold (Vt) of bias transistors (i.e., MP2 and MP3) shift higher. As a result, magnitude of First power supply collapse increases, which increases the probability of AC retention failures. The Adaptive WA scheme of the embodiments mitigates this write failure risk due to aging.

Figure 3:
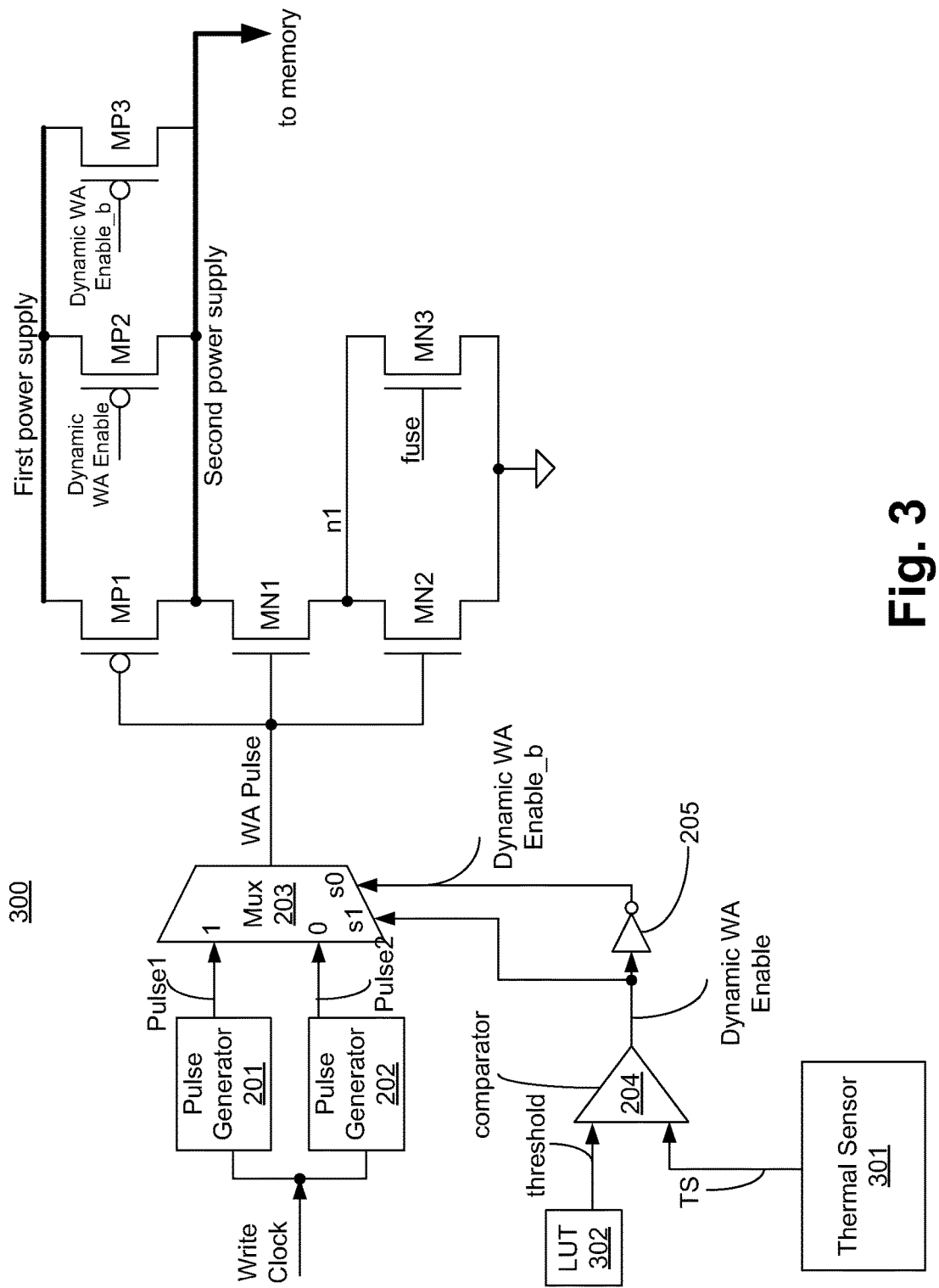
FIG. 3 illustrates a circuit for providing dynamic or adaptive power supply collapse WA to a memory according to changing temperature, according to one embodiment of the disclosure.

FIG. 3 illustrates a circuit 300 for providing dynamic or adaptive WA to a memory according to changing temperature, according to one embodiment of the disclosure. It is pointed out that those elements of FIG. 3 having the same reference numbers (or names) as the elements of any other figure can operate or function in any manner similar to that described, but are not limited to such.

So as not to obscure the embodiment of FIG. 3, differences between FIG. 2 and FIG. 3 are discussed, and previously described features are not discussed in detail again. In one embodiment, comparator 204 receives temperature threshold and a sensed temperature (TS) to generate Dynamic WA Enable signal and Dynamic WA Enable_b signal. Here, labels for signal names and nodes are interchangeable used. For example, Dynamic WA Enable may refer to Dynamic WA Enable signal or node Dynamic WA Enable depending on the context of the sentence. Compared to the embodiment of FIG. 2, the embodiment of FIG. 3 uses changing temperature as a source for adaptive or dynamic WA for memory 102.

In one embodiment, circuit 300 comprises Thermal Sensor 301 and Look-up Table (LUT) 302 along with other logic units and transistors described with reference to FIG. 2. In one embodiment, comparator 204 is an analog comparator (e.g., a single stage operational amplifier). In one embodiment, TS is provided by Thermal Sensor 301. In one embodiment, TS is an analog signal indicating temperature of the processor having memory 102. In one embodiment, threshold is an analog signal indicating a temperature threshold. In one embodiment, threshold can be adjusted by selecting one of many thresholds from LUT 302. In one embodiment, threshold can be selected for LUT 302 using fuses or software.

In one embodiment, comparator 204, Thermal Sensor 301, LUT 302, and inverter 205 form Temperature Sensor 104. However, Thermal Sensor 301, LUT 302, and inverter 205 can be part of Adaptive Modulator Circuit 101 or distributed between other logic units.

In one embodiment, for adaptively adjusting magnitude and duration of droop in Second power supply, comparator 204 senses change in operating temperature (i.e., current temperature) of processor having memory 102. In one embodiment, output of comparator indicates whether current temperature TS is above or below the threshold. In this example, for purposes of explaining the embodiment, output of comparator 204 is logic high output when current temperature exceeds the threshold, and is logic low output when current temperature falls below the threshold.

Adaptive WA scheme of circuit 300 can be described with the following example. Assume that temperature, to achieve 2.5 GHz frequency operation, is in the range of 75° C. In this example, threshold is set to 750 mV which indicates 75° C. When operating temperature falls below 75° C., Dynamic WA Enable transitions from logic low to logic high while Dynamic WA Enable_b transitions from logic high to logic low. In this embodiment, MP3 is enabled (i.e., turned ON) while MP2 is disabled (i.e., turned OFF). Since MP3 is larger in size than MP2, WA bias strength increases. Continuing with the example, Mux 203 selects Pulse1 for WA Pulse which is received by MP1, MN1, and MN2. Here, a stronger WA bias setting prevents AC (alternating current) retention failures while a longer WA pulse width setting (by selecting Pulse1) ensures cell write-ability.

When current temperature rises above Adjustable threshold of 75° C., Dynamic WA Enable transitions from logic low to logic high while Dynamic WA Enable_b transitions from logic high to logic low. In such an embodiment, MP2 is enabled while MP3 is disabled. Continuing with the example, Mux 203 selects Pulse2 for WA Pulse which is received by MP1, MN1, and MN2. Pulse2 is shorter than Pulse1 in pulse width. A weaker WA bias setting lowers power consumption since depth of collapse in Second power supply is reduced. A shorter WA pulse width setting allows for cell write-ability while allowing the processor to operate at a higher voltage and/or frequency.

In one embodiment, comparator 204 is a digital comparator. For example, comparator 204 is implemented using exclusive-OR (XOR) logic gates. In such an embodiment, threshold from LUT 302 is a digital threshold and TS from Thermal Sensor 301 is a digital signal indicating current temperature. In one embodiment, when TS exceeds threshold, a different set of WA pulse width and bias settings is chosen. For example, a deeper collapse can be used for cold temperatures (e.g., 10° C.) to improve bit-cell write-ability.

Figure 4:
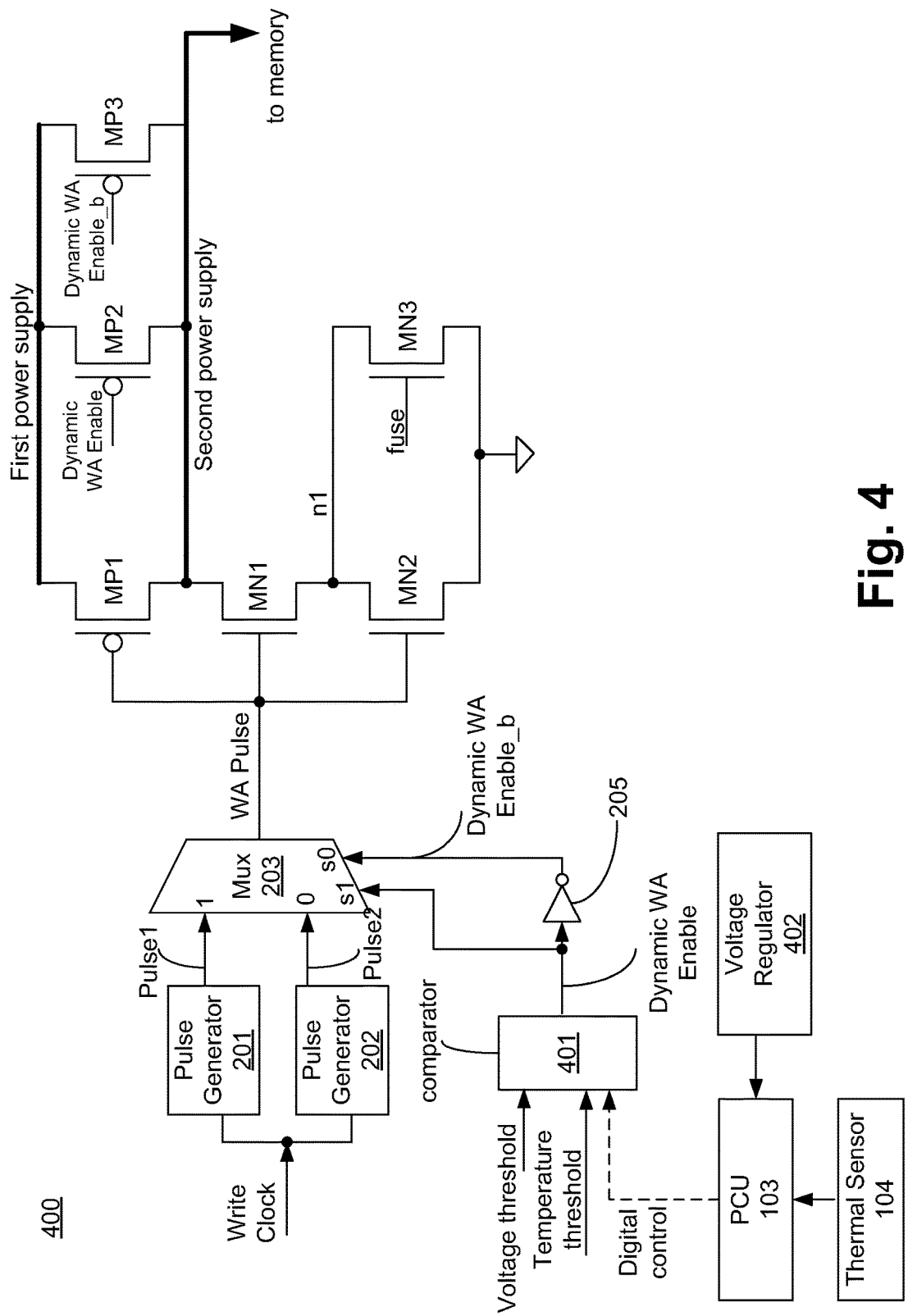
FIG. 4 illustrates a circuit for providing dynamic or adaptive power supply collapse WA to a memory according to changing voltage supply levels and temperature, according to one embodiment of the disclosure.

FIG. 4 illustrates a circuit 400 for providing dynamic or adaptive WA to a memory according to changing voltage supply levels and temperature, according to one embodiment of the disclosure. It is pointed out that those elements of FIG. 4 having the same reference numbers (or names) as the elements of any other figure can operate or function in any manner similar to that described, but are not limited to such.

So as not to obscure the embodiments, differences between FIGS. 2-3 and FIG. 4 are discussed, and previously described features are not discussed in detail again. In one embodiment, Adaptive Modulator Circuit 101 (which is part of circuit 400) is an all digital implementation that dynamically adapts WA according to changing temperature, voltage, and/or frequency of the processor having memory 102.

In one embodiment, circuit 400 comprises a digital comparator 401 (e.g., XOR logic gates). In one embodiment, digital comparator 401 receives voltage threshold as a digital signal from PCU 103 as shown by dashed line Digital control. In some embodiments, digital comparator 401 receives voltage threshold as a digital signal from another logic circuit. In one embodiment, voltage threshold indicates a threshold of First power supply. For example, voltage threshold may be a series of bits (e.g., 001111) indicating 750 mV threshold. In one embodiment, First power supply is generated by Voltage Regulator (VR) 402 which receives an input power supply and generates a regulated First power supply. In one embodiment, VR 402 is any voltage regulator. For example, VR 402 is a switched capacitor based buck VR, or a DC-DC converter.

In one embodiment, digital comparator 401 receives temperature threshold as a digital signal from PCU 103. In one embodiment, temperature threshold indicates a reference temperature in the form of a series of bits. For example, temperature threshold may be 000011 that indicates 75° C. temperature threshold. In one embodiment, Thermal Sensor 104 generates an analog signal indicating current temperature. In one embodiment, PCU 103 receives this analog signal and generates a digital word representing the current temperature. In some embodiments, Thermal Sensor 104 may provide a digital work representing the current temperature which is passed down by PCU 103 to digital comparator 401 (as shown by dashed line Digital control) or provided directly by Thermal Sensor 104 to digital compactor 401. One technical effect of using an all digital Adaptive Modulator Circuit 101 and associated circuits, analog compactor (e.g., operational amplifier), resistor stack, bandgap reference, etc., are eliminated which reduces power consumption and area.

Adaptive WA scheme of circuit 400 can be described with the following example. Assume that temperature and First power supply, achieve 2.5 GHz frequency operation, are in the range of 75° C. and 750 mV, respectively. In this example, voltage threshold is set to 750 mV (i.e., bit code 00011, for example) while temperature threshold is set at 75° C. (i.e., bit code 10001, for example).

When operating temperature (i.e., TS) falls below 75° C., Dynamic WA Enable transitions from logic low to logic high while Dynamic WA Enable_b transitions from logic high to logic low. In one embodiment, when First power supply falls below 750 mV, Dynamic WA Enable may also transition from logic low to logic high while Dynamic WA Enable_b transitions from logic high to logic low. In this embodiment, MP3 is enabled (i.e., turned ON) while MP2 is disabled (i.e., turned OFF). Since MP3 is larger in size than MP2, WA bias strength increases. Continuing with the example, Mux 203 selects Pulse1 for WA Pulse which is received by MP1, MN1, and MN2. Here, a stronger WA bias setting prevents AC (alternating current) retention failures while a longer WA pulse width setting (by selecting Pulse1) ensures cell write-ability.

When TS rises above threshold of 75° C., Dynamic WA Enable transitions from logic low to logic high while Dynamic WA Enable_b transitions from logic high to logic low. In such an embodiment, MP2 is enabled while MP3 is disabled. Continuing with the example, Mux 203 selects Pulse2 for WA Pulse which is received by MP1, MN1, and MN2. Pulse2 is shorter than Pulse1 in pulse width. A weaker WA bias setting lowers power consumption because there is no risk of AC retention failure. A shorter WA pulse width setting allows for cell write-ability while allowing the processor to operate at a higher voltage and/or frequency.

The embodiments are applicable to many different types of memories. For example, the embodiments are applicable to Dual Port SRAM, Register Files, and CAM memories. Traditional Dual Port SRAM cannot rely upon conventional power supply collapse WA mechanism because of the possibility of concurrent read and write access to different rows along a column which is experiencing power supply collapse. The collapsed power supply make lead to stability failures if a read access occurs to another word line. In one embodiment, NBL WA technique is used to provide VMIN reduction. In one embodiment, NBL along with collapsing Second power supply improves write-ability of Dual Port SRAM bit-cells.

Figure 5:
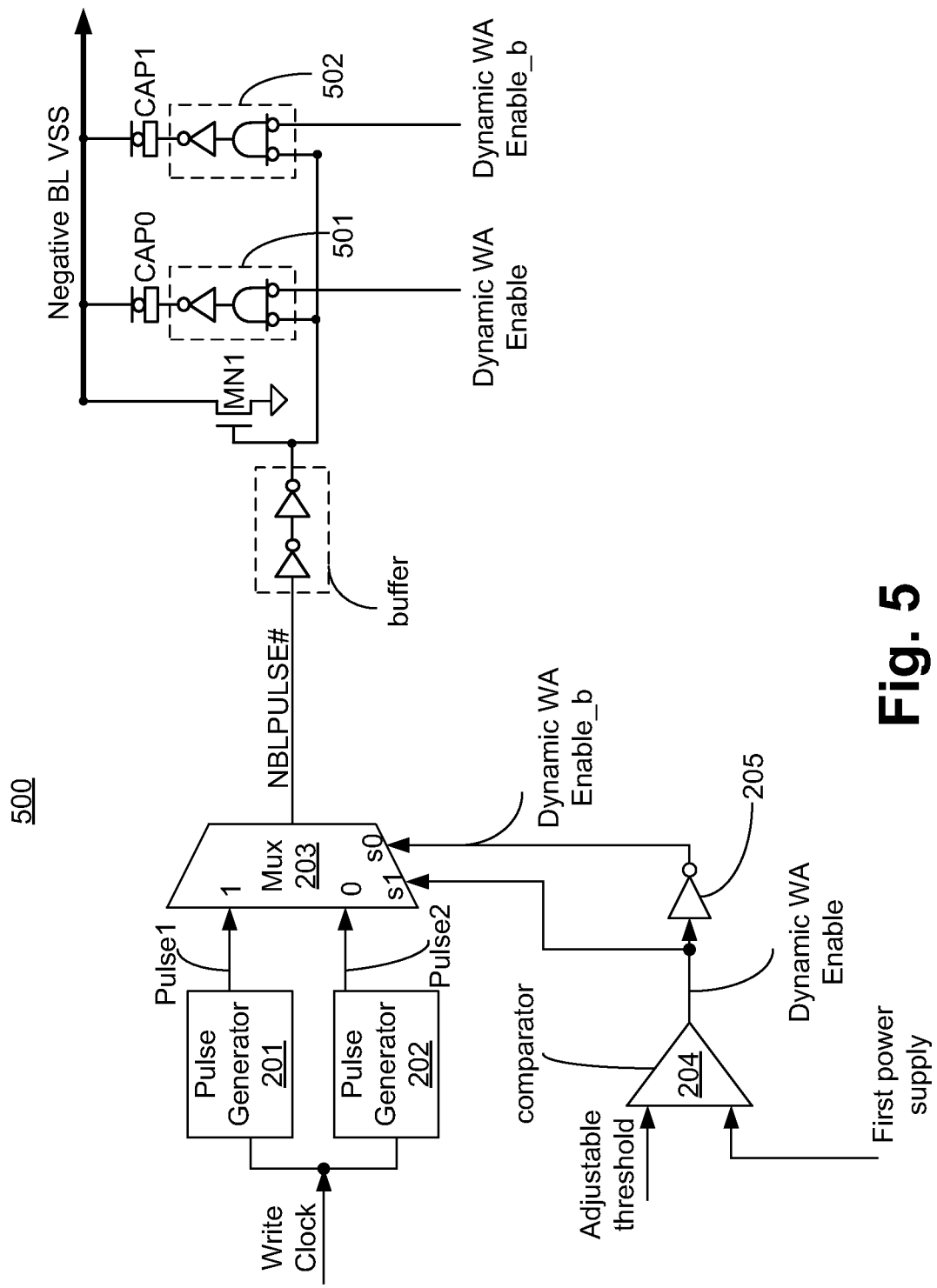
FIG. 5 illustrates a circuit for providing dynamic or adaptive negative bit-line (NBL) WA to a memory according to changing voltage supply levels, according to one embodiment of the disclosure.

FIG. 5 illustrates a circuit 500 for providing dynamic or adaptive NBL WA to a memory according to changing voltage supply levels, according to one embodiment of the disclosure. It is pointed out that those elements of FIG. 5 having the same reference numbers (or names) as the elements of any other figure can operate or function in any manner similar to that described, but are not limited to such. The embodiment of FIG. 5 is explained with reference to FIG. 2. So as not to obscure the embodiments, components discussed in FIG. 2 are not discussed in detail.

Circuit 500 includes components of FIG. 2, a buffer (optional), n-type transistor MN1, logic units 501 and 502, and capacitors CAP0 and CAP1. In one embodiment, pulse generators 201 and 202 generates NBLPULSE# signal (i.e., inverted version of NBL pulse signal) from the Write Clock signal. In one embodiment, comparator 204 and Mux 203 determine the NBL control settings for pulse and capacitor size based on the First power supply voltage. For example, when the First power supply voltage exceeds the adjustable threshold, then a weaker NBL control setting (i.e., smaller capacitor size) is used.

Figure 6:
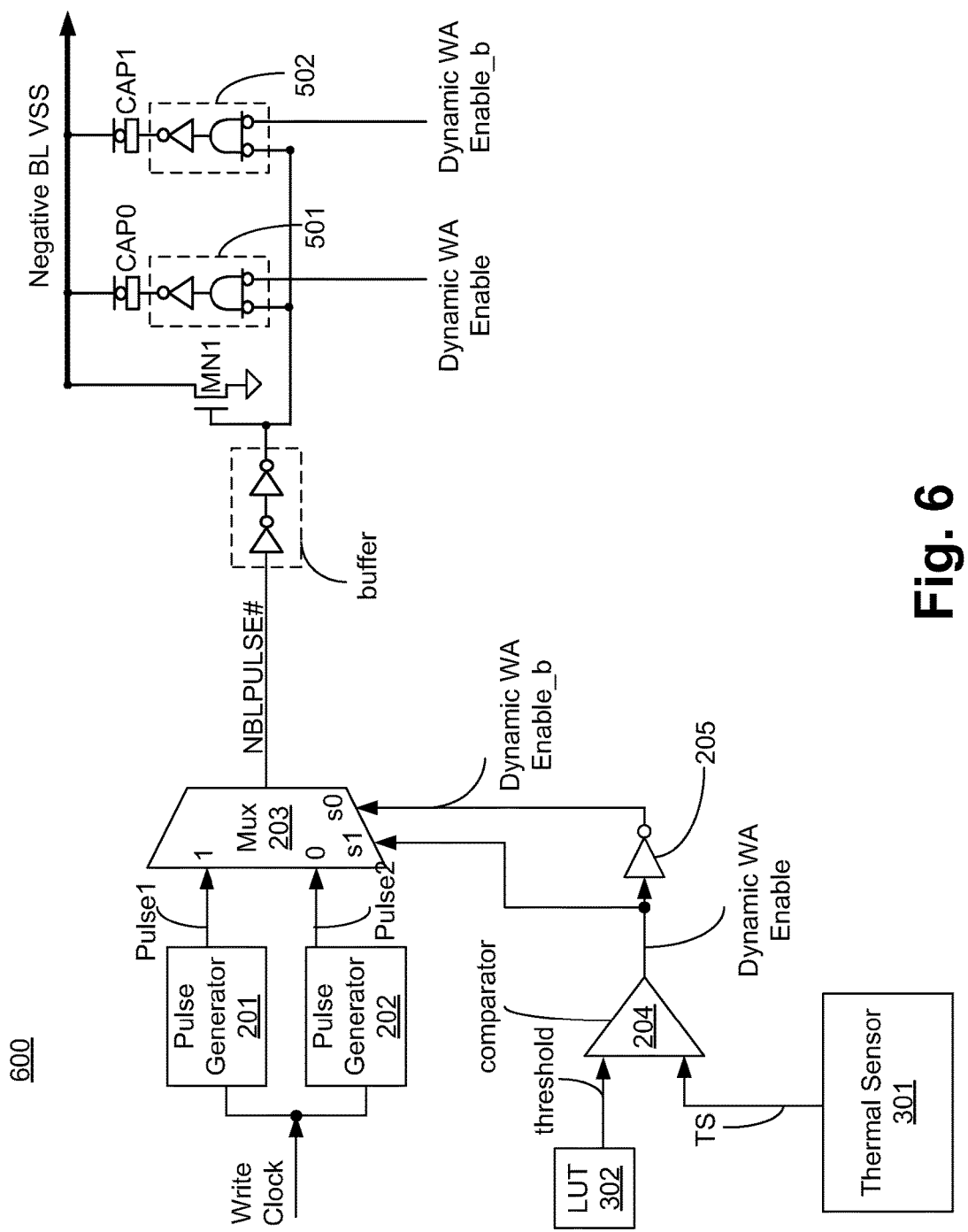
FIG. 6 illustrates a circuit for providing dynamic or adaptive NBL WA to a memory according to changing temperature, according to one embodiment of the disclosure.

FIG. 6 illustrates a circuit 600 for providing dynamic or adaptive NBL WA to a memory according to changing temperature, according to one embodiment of the disclosure. The embodiment of FIG. 6 is explained with reference to FIG. 3 and FIG. 5. So as not to obscure the embodiments, components discussed in FIG. 3 and FIG. 5 are not discussed in detail. Circuit 600 illustrates how NBL control settings can be dynamically determined using Thermal Sensor 301.

In one embodiment, pulse generators 201 and 202 generates NBLPULSE# signal (i.e., inverted version of NBL pulse signal) from the Write Clock signal. In one embodiment, comparator 204 and Mux 203 determine the NBL control settings for pulse and capacitor size based on the operating temperature TS provided by Thermal Sensor 301. For example, when the operating temperature exceeds the adjustable threshold from LUT 302, then a weaker NBL control setting (i.e., smaller capacitor size) is used.

Figure 7:
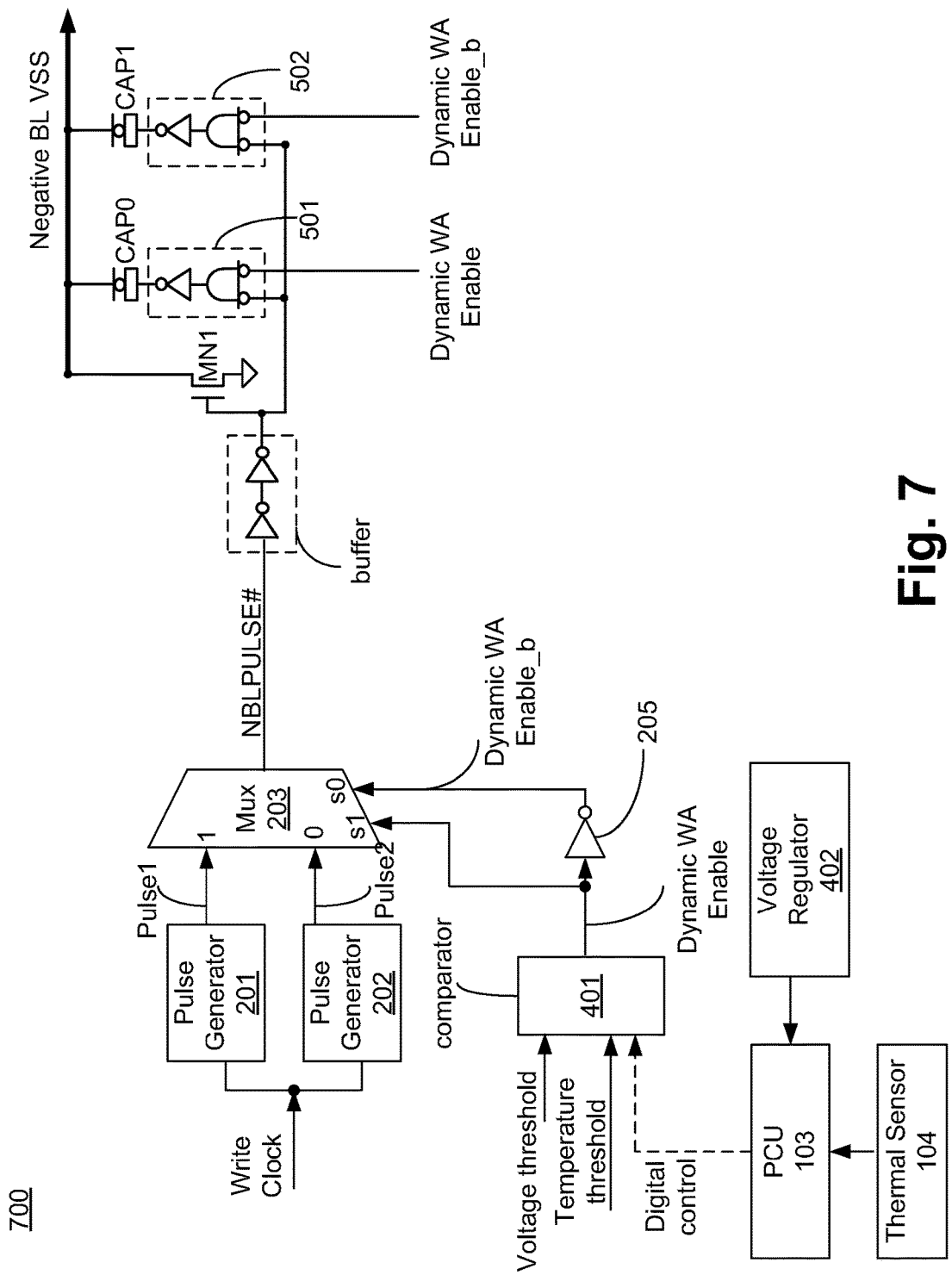
FIG. 7 illustrates a circuit for providing dynamic or adaptive NBL WA to a memory according to changing voltage supply levels and temperature, according to one embodiment of the disclosure.

FIG. 7 illustrates a circuit 700 for providing dynamic or adaptive NBL WA to a memory according to changing voltage supply levels and temperature, according to one embodiment of the disclosure. The embodiment of FIG. 7 is explained with reference to FIG. 4 and FIG. 5. So as not to obscure the embodiments, components discussed in FIG. 4 and FIG. 5 are not discussed in detail. FIG. 7 illustrates how NBL control settings can be dynamically determined using Voltage Regulator 402 and Thermal Sensor 104.

In one embodiment, Pulse Generators 201 and 302 generates NBLPULSE# signal (i.e., inverted version of NBL pulse signal) from the Write Clock signal. In one embodiment, comparator 401 and Mux 203 determines the NBL control settings for pulse and capacitor size based on the operating temperature TS provided by Thermal Sensor 104 and operating voltage provided by Voltage Regulator 402. For example, when the operating temperature exceeds the Temperature threshold and/or operating voltage exceeds Voltage Threshold, then a weaker NBL control setting (i.e., smaller capacitor size) is used.

The embodiments are applicable to many different types of memories. For example, the embodiments are applicable to Dual Port SRAM, Register Files, and CAM memories. Traditional Dual Port SRAM cannot rely upon conventional power supply collapse WA mechanism because of the possibility of concurrent read and dummy read access to different rows along a column which is experiencing power supply collapse. The collapsed power supply may lead to stability failures if a read or dummy read access occurs to another word line.

In Dual-Port SRAM design, the worst case read stability stress may happen when there is a row collision i.e., when two operations (e.g., any combinations of read and write) occur on the same row. Since the Dual-Port SRAM bit-cells are designed to be read stable during a row collision, the read stability margin of the bit-cell is higher when row collision does not occur. Therefore, there is a marginal opportunity to use a shallow power supply collapse along with NBL WA to expand the read/write process margin of the Dual-Port SRAM bit-cell. In one embodiment, only NBL WA technique is used to enhance the write-ability at a higher operating voltage. In another embodiment, NBL along with collapsing Second power supply can be simultaneously applied to expand the write-ability window of Dual Port SRAM bit-cells to achieve lower operating VMIN.

Figure 8:
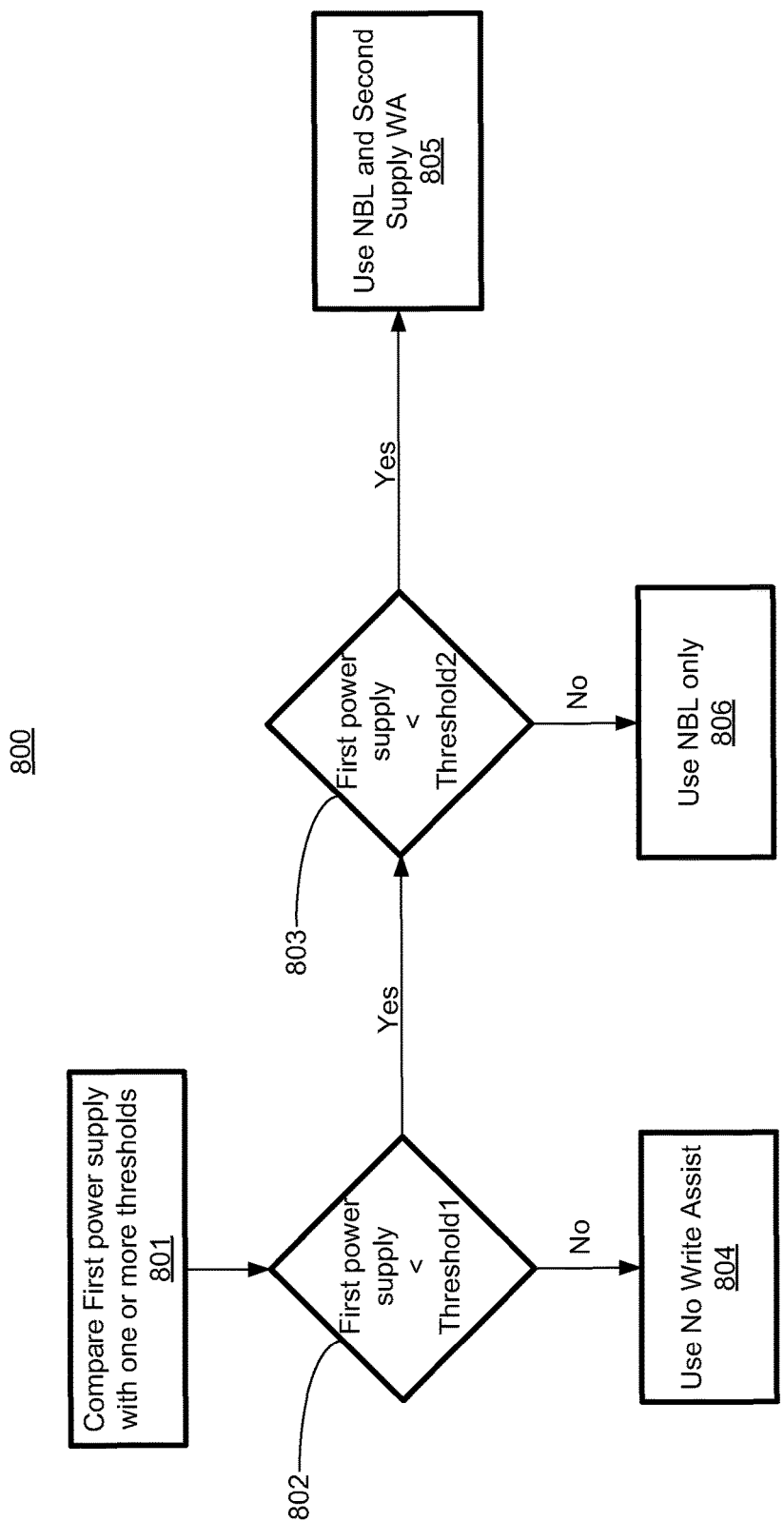
FIG. 8 illustrates a flowchart showing a method of using adaptive NBL WA technique and adaptive power supply collapse WA technique according to changing power supply and temperature, according to one embodiment of the disclosure.

FIG. 8 illustrates a flowchart 500 showing a method of using NBL WA technique and power supply WA technique according to changing power supply and temperature, according to one embodiment.

Although the blocks in the flowcharts with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 801, voltage level of the First power supply is compared with a voltage threshold. In one embodiment, the voltage threshold may be an analog voltage. In such an embodiment, comparator 204 is an analog comparator (e.g., an amplifier). In one embodiment, at block 801, a digital version of the First power supply (e.g., code 10001) is compared with a digital voltage threshold (e.g., code 10011). In such an embodiment comparator 204 is a digital comparator (e.g., a plurality of XOR logic gates).

At block 802, a determination is made whether the voltage level of the First power supply is less than a first threshold Threshold1 (e.g., a first voltage threshold). If the voltage level of the First power supply is less than the voltage threshold then the process proceeds to block 803, else the process proceeds to block 804. At block 804, no WA technique is used i.e., Adaptive Modulator Circuit 101 disables all WA techniques. In such an embodiment, the voltage level of the Second power supply is not collapsed and the magnitude of negative drip on bit-line is not modulated resulting in least write power consumption.

At block 803, a determination is made whether the voltage level of the First power supply is less than a second threshold Threshold2 (e.g., a second voltage threshold).). If the voltage level of the First power supply is less than the second voltage threshold then the process proceeds to block 805, else the process proceeds to block 806. At block 805, Adaptive Modulator Circuit 101 enables both NBL WA technique and Second power supply collapse WA technique. In such an embodiment, voltage collapse of the Second power supply is modulated and magnitude of negative droop on bit-line is also modulated. At block 806, Adaptive Modulator Circuit 101 enables only NBL WA technique. In such an embodiment, the voltage level of the Second power supply is not collapsed but magnitude of negative droop on bit-line is also modulated.

In one embodiment, WA technique is an NBL WA technique in which Adaptive Modulator 101 modulates capacitor size and/or bias conditions to either of the capacitor plates to adjust the negative charge on bit-lines during write operation.

Figure 9C:
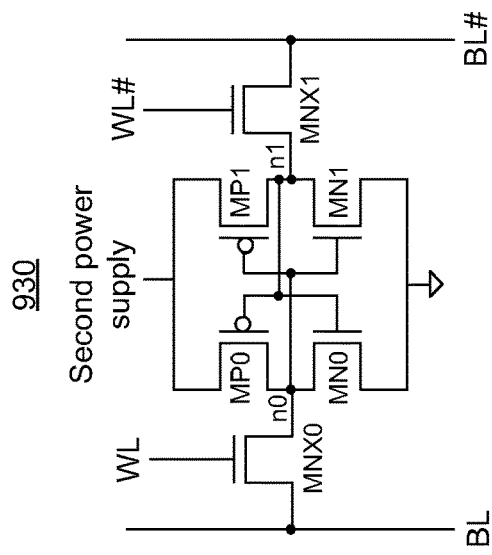
FIG. 9C illustrates a 6T SRAM bit-cell.
Figure 9B:
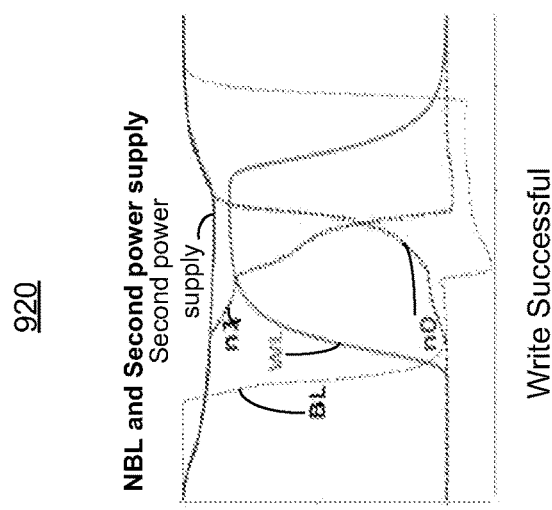
FIGS. 9A-B illustrate plots showing impacts of NBL WA technique and NBL with power supply collapse WA technique, according to one embodiment of the disclosure.
Figure 9A:
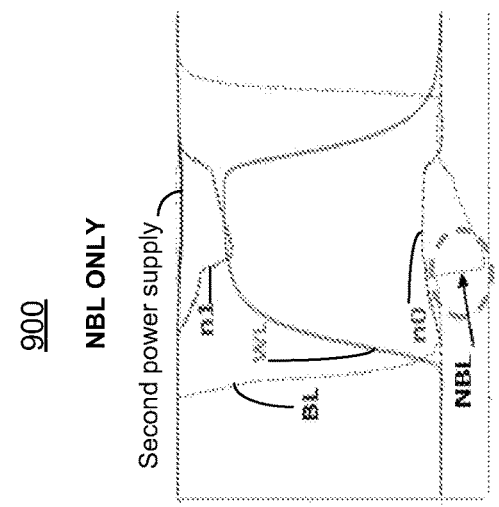

FIGS. 9A-B illustrate plots 900 and 920 showing impacts of NBL WA technique and NBL with power supply collapse WA technique respectively, according to one embodiment. Here, x-axis is time and y-axis is voltage. In each plot, voltages on nodes n1, WL (word-line), BL (bit-line), and n0 are shown. Nodes, n0 and n1 correspond to memory bit-cell internal nodes.

One such 6T-SRAM bit-cell 930 is shown in FIG. 9C. Bit-cell 930 is a traditional SRAM cell having n-type access transistors MNX0 and MNX1 coupled to BL, n0, BL#, and n1 as shown. Bit-cell 930 also includes the cross-coupled inverters having p-type transistors MP0 and MP1, and n-type transistors MN0 and MN1 as shown. Second power supply is coupled to p-type transistors MP0 and MP1. Negative droop on BL is provided by negative charge on capacitor (not shown) coupled to BL. The magnitude of negative droop (i.e., under drive) on BL is controlled by adjusting bias voltage to either one of the plates of the capacitor and/or changing the size of the capacitor.

Referring back to FIG. 9A, plot 900 shows a write operation failure caused by NBL only WA technique in which the voltage level of the Second power supply (i.e., SRAMVCC) remains constant while BL is pulled low dynamically when WL is high, but BL is not low enough to flip the bit i.e., write data to the bit-cell. Plot 920 in FIG. 9B shows a successful write operation in which both NBL and Second power supply collapse (i.e., VCC Collapse) WA techniques are deployed to flip voltages on nodes n0 and n1 which result in new data written to the bit-cell.

Figure 10:
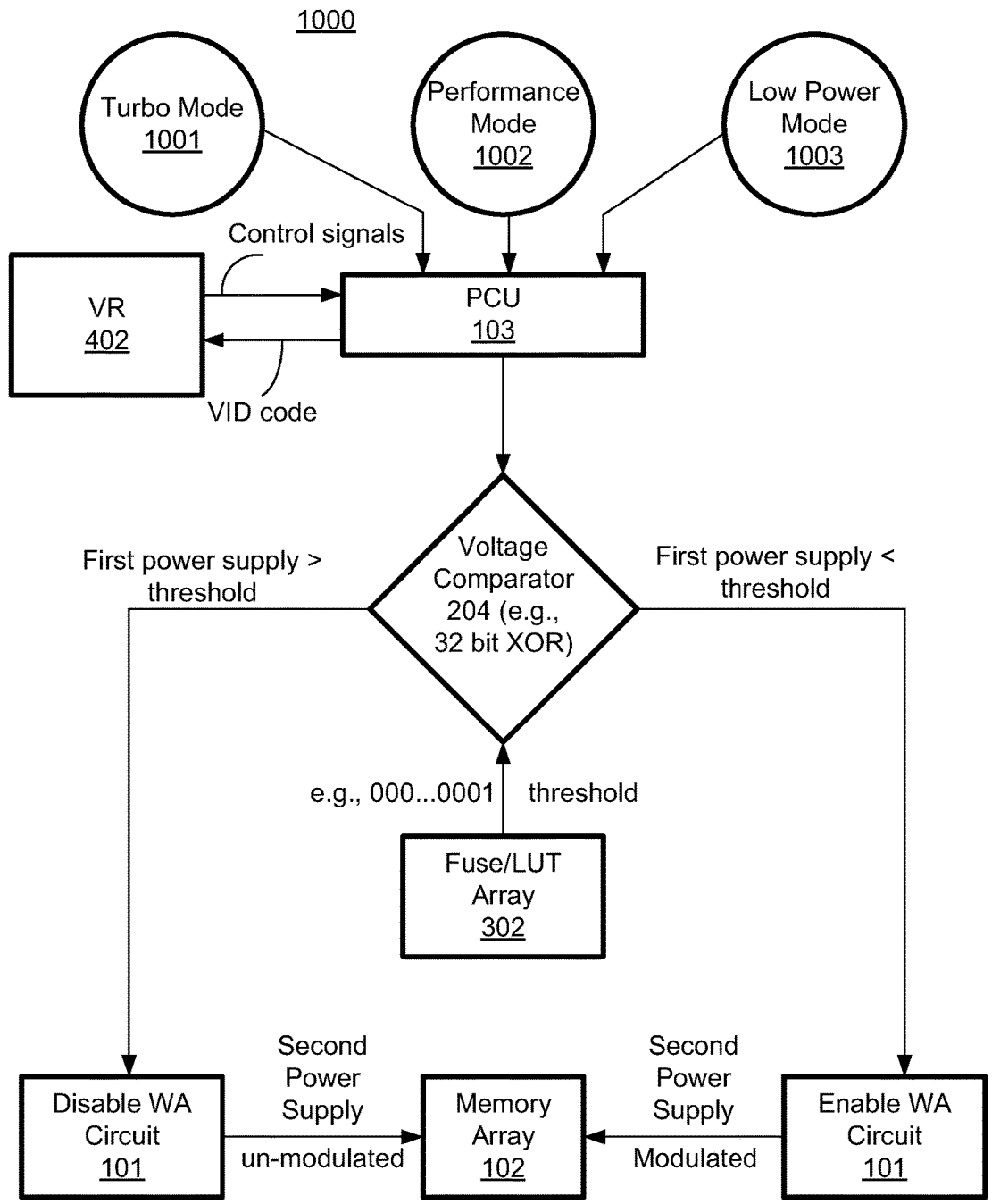
FIG. 10 illustrates a flowchart showing a method and apparatus of using WA technique, according to one embodiment of the disclosure.

FIG. 10 illustrates a flowchart 1000 showing a method and apparatus of using WA technique, according to one embodiment of the disclosure. It is pointed out that those elements of FIG. 10 having the same reference numbers (or names) as the elements of any other figure can operate or function in any manner similar to that described, but are not limited to such. Although the blocks in the flowcharts with reference to FIG. 10 are shown in a particular order, the order of the actions can be modified. Thus, the illustrated embodiments can be performed in a different order, and some actions/blocks may be performed in parallel. Some of the blocks and/or operations listed in FIG. 10 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Blocks 1001, 1002, and 1003 illustrate various modes of operating the processor or system having memory 102. Block 1001 is the Turbo mode which operates with high First power supply (e.g., 1.2V) and high frequency. Generally, temperature of the processor also increases in Turbo mode. Block 1002 is the Performance mode which operates with nominal First power supply (e.g., 1.0V) and nominal frequency (which is lower than the high frequency of Turbo mode). Block 1003 is the Low Power mode which operates with low First power supply (e.g., VMIN level of 0.7V) and low frequency (which is lower than the nominal frequency). In one embodiment, PCU 103 adjusts the First power supply by controlling VR 402. In one such embodiment, PCU 103 sends control signals to VR 402 which provides voltage identification (VID) code representation of First power supply.

In one embodiment, voltage comparator 204 is a digital comparator and compares First power supply VID code (e.g., a 32 bit code) with a 32-bit reference code (i.e., threshold) from fuse array or LUT 302. In one embodiment, if the voltage level of the First power supply is greater than the threshold then the Adaptive Modulator Circuit 101 is disabled i.e., WA circuit is disabled. In such an embodiment, voltage level of the Second power supply to Memory Array 102 is held constant (i.e., un-modulated). In one embodiment, if the voltage level of the First power supply is less than the threshold then Adaptive Modulator Circuit 101 is enabled i.e., WA circuit is enabled. In such an embodiment, the voltage level of the Second power supply to Memory Array 102 is modulated.

Figure 11:
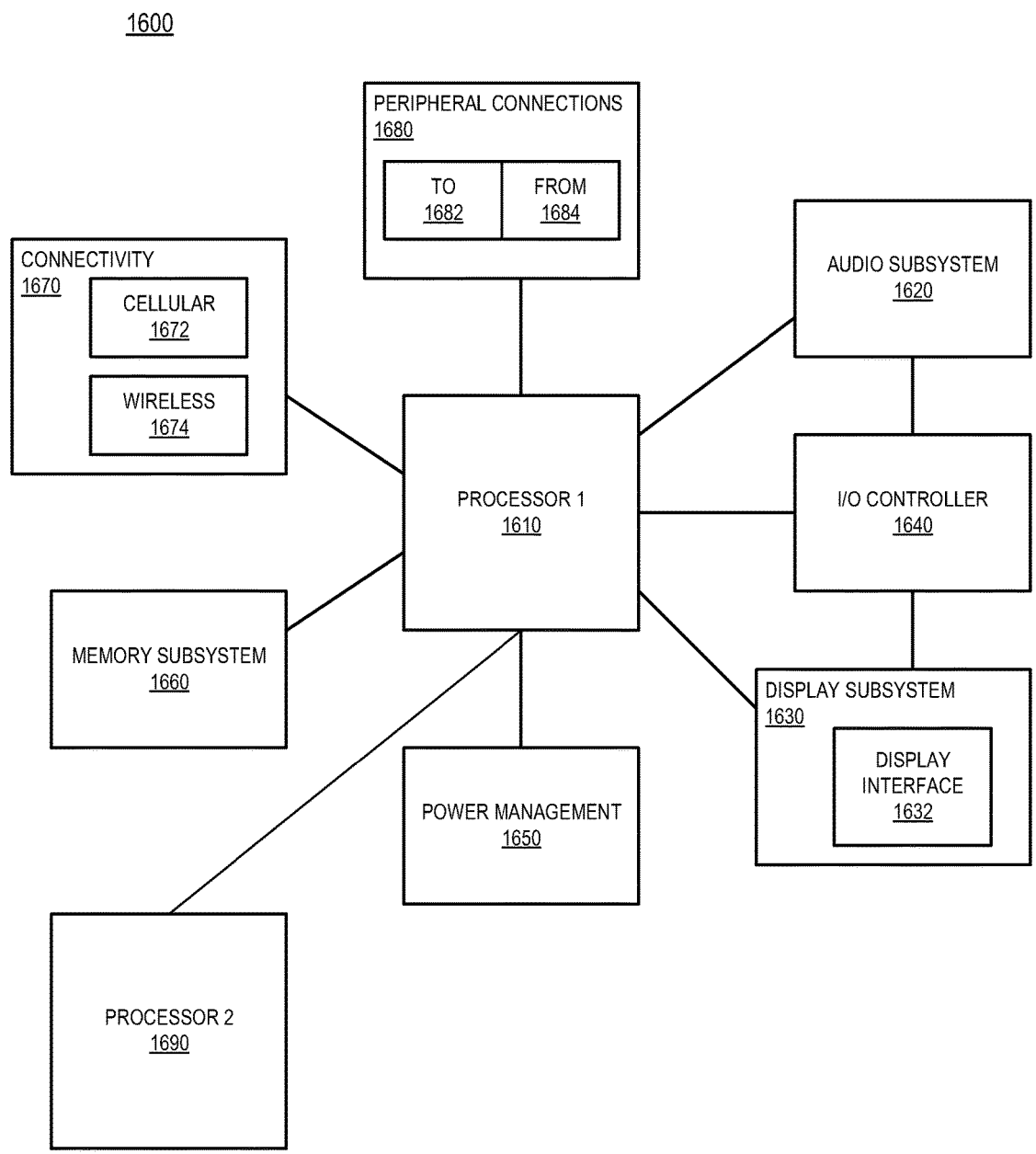
FIG. 11 is a smart device or a computer system or an SoC (System-on-Chip) with apparatus for providing dynamic or adaptive WA to a memory, according to one embodiment of the disclosure.

FIG. 11 is a smart device or a computer system or an SoC (System-on-Chip) with apparatus for providing dynamic or adaptive WA to a memory, according to one embodiment of the disclosure. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with apparatus for providing dynamic or adaptive WA to a memory described with reference to embodiments. Other blocks of the computing device 1600 may also include apparatus for providing dynamic or adaptive WA to a memory described with reference to embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a memory; a first power supply node to receive a first power supply; a second power supply node, coupled to the memory, to provide the memory with a second power supply; and a circuit coupled to the first and second power supply nodes, the circuit operable to dynamically modulate droop in the second power supply by adaptively adjusting signal characteristics of a write assist pulse.

In one embodiment, the circuit is operable to dynamically modulate droop in the second power supply by adjusting pulse width of the write assist pulse. In one embodiment, the circuit is operable to dynamically modulate droop in the second power supply by adjusting drive strength of one or more transistors coupled to the first and second power supply nodes. In one embodiment, the circuit comprises a voltage sensor to sense the first power supply relative to a threshold reference voltage. In one embodiment, the circuit comprises a thermal sensor to sense temperature.

In one embodiment, the circuit is operable to enable negative bit-line based write assist and modulate the second power supply when the first power supply drops below a temperature threshold. In one embodiment, the circuit is operable to enable only the negative bit-line based write assist when the first power supply is above the temperature threshold. In one embodiment, the circuit comprises a digital comparator to compare a digital signal from a power control unit with one or more of a voltage threshold and temperature threshold. In one embodiment, the memory is one of: an SRAM; a Register File; or a CAM.

In another example, an apparatus is provided which comprises: a memory; one or more power gate transistors coupled to a first power supply node to receive a first power supply, and a second power supply node to provide a second power supply to the memory; and a circuit to dynamically control gate terminals of the one or more power gate transistors to modulate droop in the second power supply. In one embodiment, the circuit is operable to dynamically modulate duration of the droop in the second power supply by adaptively adjusting pulse width of a write assist signal.

In one embodiment, the circuit comprises a voltage sensor to sense the first power supply relative to a threshold reference voltage. In one embodiment, the circuit comprises a thermal sensor to sense temperature. In one embodiment, the circuit comprises a digital comparator to compare a digital signal from a power control unit with one or more of a voltage threshold and temperature threshold.

In another example, a system is provided which comprises: a memory; a processor coupled to the memory, the processor including: a first power supply node to receive a first power supply; a second power supply node coupled to the cache to provide the cache with a second power supply; a circuit coupled to the first and second power supply nodes, the circuit operable to dynamically modulate droop in the second power supply by adaptively adjusting signal characteristics of a write assist signal; and a wireless interface for allowing the processor to communicatively couple to another device.

In one embodiment, the system further comprises a display unit. In one embodiment, the display unit is a touch screen. In one embodiment, the circuit includes an apparatus according to the apparatus discussed above. In one embodiment, the cache is one of an SRAM; a Register File; or a CAM.

In another example, an apparatus is provided which comprises: a memory array; and a circuit coupled to bit-lines of the memory array, the circuit operable to dynamically modulate voltage droop in the bit-lines of the memory array by adaptively adjusting the capacitance associated with the bit-lines. In one embodiment, the circuit comprises a thermal sensor to sense operating temperature.

In one embodiment, the circuit comprises a voltage sensor to sense an input power supply which is used to generate a power supply for the memory array. In one embodiment, the memory array is one of: an SRAM; a Register File; or a CAM.

In one embodiment, a system is provided which comprises: a memory, a processor coupled to the memory, and a wireless interface to allow the processor to communicate with another device, wherein the processor includes an apparatus according to the apparatus discussed above.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a processor;
a memory;
a first power supply node to receive a first power supply;
a second power supply node, coupled to the memory, to provide the memory with a second power supply; and
a circuit coupled to the first and second power supply nodes, the circuit operable to dynamically modulate droop in the second power supply dependent on at least a change in operating voltage, frequency, or temperature conditions of the processor by adaptively adjusting signal characteristics of a write assist pulse based on at least a first power supply voltage being below or above a programmable threshold voltage.
2. The apparatus of claim 1, wherein the circuit is operable to dynamically modulate droop in the second power supply by adjusting pulse width of the write assist pulse.

3. The apparatus of claim 1, wherein the circuit is operable to dynamically modulate droop in the second power supply by adjusting drive strength of one or more transistors coupled to the first and second power supply nodes.

4. The apparatus of claim 1, wherein the circuit comprises a voltage sensor to sense the first power supply relative to the programmable threshold voltage.

5. The apparatus of claim 1, wherein the circuit comprises a thermal sensor to sense temperature.

6. The apparatus of claim 1, wherein the circuit is operable to enable negative bit-line based write assist and modulate the second power supply when the first power supply drops below a temperature threshold.

7. The apparatus of claim 6, wherein the circuit is operable to enable only the negative bit-line based write assist when the first power supply is above the temperature threshold.

8. The apparatus of claim 1, wherein the circuit comprises a digital comparator to compare a digital signal from a power control unit with one or more of a voltage threshold and temperature threshold.

9. The apparatus of claim 1, wherein the memory is one of:
   an SRAM;
   a Register File; or
   a CAM.

10. An apparatus comprising:
   a processor;
   a memory;
   one or more power gate transistors coupled to a first power supply node to receive a first power supply, and a second power supply node to provide a second power supply to the memory; and
   a circuit to dynamically control gate terminals of the one or more power gate transistors to modulate droop in the second power supply dependent on at least a change in an operating voltage, frequency, or temperature conditions of the processor and at least a first power supply voltage being below or above a programmable threshold voltage.

11. The apparatus of claim 10, wherein the circuit is operable to dynamically modulate duration of the droop in the second power supply by adaptively adjusting pulse width of a write assist signal.

12. The apparatus of claim 10, wherein the circuit comprises a voltage sensor to sense the first power supply relative to the programmable threshold voltage.

13. The apparatus of claim 10, wherein the circuit comprises a thermal sensor to sense temperature.

14. The apparatus of claim 10, wherein the circuit comprises a digital comparator to compare a digital signal from a power control unit with one or more of a voltage threshold and temperature threshold.

15. A system comprising:
   a memory including a cache;
   a processor coupled to the memory, the processor including:
      a first power supply node to receive a first power supply;
      a second power supply node coupled to the cache to provide the cache with a second power supply;
      a circuit coupled to the first and second power supply nodes, the circuit operable to dynamically modulate droop in the second power supply dependent on at least a change in an operating voltage, frequency, or temperature conditions of the processor by adaptively adjusting signal characteristics of a write assist signal based on at least a first power supply voltage being below or above a programmable threshold voltage; and
   a wireless interface for allowing the processor to communicatively couple to another device.

16. The system of claim 15 further comprising a display unit.

17. The system of claim 16, wherein the display unit is a touch screen.

18. The system of claim 15, wherein the circuit is operable to dynamically modulate droop in the second power supply by adjusting pulse width of the write assist pulse.

19. The system of claim 15, wherein the cache is one of:
   an SRAM;
   a Register File; or
   a CAM.

20. The system of claim 15, wherein the circuit is operable to dynamically modulate droop in the second power supply by adjusting drive strength of one or more transistors coupled to the first and second power supply nodes.

* * * * *